United States Patent
Koinuma et al.

(10) Patent No.: US 6,344,084 B1
(45) Date of Patent: Feb. 5, 2002

(54) COMBINATORIAL MOLECULAR LAYER EPITAXY DEVICE

(75) Inventors: Hideomi Koinuma; Masashi Kawasaki, both of Yokohama (JP)

(73) Assignee: Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 09/554,011

(22) PCT Filed: Sep. 10, 1999

(86) PCT No.: PCT/JP99/04946

§ 371 Date: May 9, 2000

§ 102(e) Date: May 9, 2000

(87) PCT Pub. No.: WO00/15884

PCT Pub. Date: Mar. 23, 2000

(30) Foreign Application Priority Data

Sep. 11, 1998 (JP) .............................. 10-258967
Sep. 11, 1998 (JP) .............................. 10-258968
Sep. 11, 1998 (JP) .............................. 10-258969
Sep. 11, 1998 (JP) .............................. 10-258970

(51) Int. Cl.[7] .............................................. C30B 25/12
(52) U.S. Cl. ..................... 117/201; 117/202; 117/108; 117/900; 118/715; 118/719; 118/729; 118/730
(58) Field of Search ................ 117/201, 202, 117/108, 900; 118/715, 719, 729, 730

(56) References Cited

U.S. PATENT DOCUMENTS

| | | | | |
|---|---|---|---|---|
| 4,664,940 A | * | 5/1987 | Bensoussan et al. | 117/108 |
| 5,476,811 A | * | 12/1995 | Fujii et al. | 117/108 |
| 5,501,175 A | * | 3/1996 | Tanaka et al. | 117/108 |
| 5,537,951 A | * | 7/1996 | Saito | 117/108 |
| 5,637,146 A | * | 6/1997 | Chyi | 117/108 |
| 5,660,628 A | * | 8/1997 | Sato et al. | 117/108 |
| 5,827,802 A | * | 10/1998 | Lagues | 117/108 |
| 6,033,471 A | * | 3/2000 | Nakanishi et al. | 117/108 |

FOREIGN PATENT DOCUMENTS

| | | |
|---|---|---|
| JP | 60-249328 | 12/1985 |
| JP | 61-159572 | 7/1986 |
| JP | 9-260459 | 10/1997 |

* cited by examiner

*Primary Examiner*—Robert Kunemund
(74) *Attorney, Agent, or Firm*—Armstrong, Westerman, Hattori, McLeland & Naughton, LLP

(57) ABSTRACT

A combinatorial molecular layer epitaxy apparatus is provided which includes a common chamber (22) having pressure therein controllable; one or more conveyable substrate heating units (36) having a substrate holder (48) for holding one or more substrates in the common chamber; and one or more process conducting chambers (24, 26, 28) having pressure therein controllable and provided to correspond to the substrate heating units. The process conducting chambers includes a growth chamber (24) which has a multiple raw material supply means for supplying raw materials onto a substrate (5) held by a substrate heating unit, a gas supply means for feeding a gas onto a surface of the substrate, and an instantaneous observation means for instantaneously observing epitaxial growth of monomolecular layers for each of the layers on the substrate surface, thereby rendering the formation of vacuum chambers constituting from substrate heating unit and process conducting chambers, which are controllable in temperatures and pressures.

30 Claims, 11 Drawing Sheets

(a)

(b)

(a)

(b)

(a)

(b)

COMBINATORIAL MOLECULAR LAYER EPITAXY DEVICE

TECHNICAL FIELD

This invention relates to a combinatorial molecular layer epitaxy apparatus that is useful to form an inorganic superstructure, a metallic superstructure or an organic superstructure, especially to make an efficient search for substances in a short period of time.

The invention further relates to a combinatorial molecular layer epitaxy apparatus that permits a substrate or substrates to be conveyed in the apparatus as a thin film forming system and, to be conveyed in a state in which they remain heated, and successive processing chambers to be formed as independent vacuum chambers with pressure and temperatures therein controllable independently of one chamber from another.

BACKGROUND ART

At recent times, following the discovery of lanthanum/barium/copper-oxide superconductive materials, a great progress has been made of thin film forming technologies for high temperature superconducting oxides. With such a progress, efforts have been expended extensively to search for and to investigate a variety of new functional substances for metallic, inorganic and organic materials.

In the field of forming thin films of high temperature superconducting oxides, the fact that a functional oxide material such as of perovskite type is itself a multicomponent material with a plurality of oxides makes it difficult to theoretically predict an optimized component proportion and a correlation between thin film preparing conditions and resultant properties, and provides no alternative but to adopt a trial and error approach for optimization.

Under the circumstances, X. -D. Xiang et al conducted a search for oxide high temperature super-conductors on combining a multi-sputtering thin film forming process with a mask patterning technique of covering particular areas on a substrate with masks, and effecting a combinatorial synthesis of inorganic materials in which a number of inorganic substances are synthesized parallel to each other, and showed that this approach had a power in functional search for a multicomponent material (X. -D. Xiang et al, Science, 268, 1738 (1995)).

Also, G. Briceno et al in search for colossal magnetoresistance (CMR) materials, prepared from a new material: $LnXMYCoO_{3-\delta}$(Ln=La, Y; M=Ba, Sr, Ca, Pb) with cobalt oxide as its base component, 128 specimens with varied compositions sputter-evaporated using combinatorial synthesis and thereafter sintered in an oxygen atmosphere. And based on the measurement of magnetic resistance of those specimens, they revealed that even a multi-oxide material exhibited a maximum magnetic resistance ratio 72% CMR. Significantly, discovery and optimization of a new $CoO_2$-based CMR material were achieved on conducting a combinatorial synthesis only twice with varied sintering conditions.

It can be seen, however, that a combinatorial synthesis referred to above for inorganic materials in which forming thin films are effected at a room temperature in either case only plays a role of simply controlling compositions. Also, no combinatorial synthesis has become a reality of thin films with a superstructure formed by epitaxial growth for each of molecular layers of materials either organic or inorganic.

On the other hand, it is noted that in a conventional thin film manufacturing system which involves a plurality of processing stages, wafers have been conveyed between different process stages by man or a robot, pressure and temperature process parameters have been set up for the individual processing stages one after another.

Especially where a wafer is required to have a clean surface, wafers must be conveyed through a conveying path that is hermetically sealed in a clean space.

Since such a conveyer is normally not adapted for high temperature wafers, however, it has been common to rely on a time consuming procedure in which hot wafers processed in a given process stage is cooled to a room temperature and then conveyed into a next process stage where they are heated to a required temperature for processing.

Further, the need to set up process parameters such as a reaction pressure and a wafer temperature one after another for the successive processing stages individually makes it unsuitable to process wafers continuously in different process stages.

Accordingly, the present invention is provided to resolve such problems met in the prior art as described, and has for its first object to provide a combinatorial molecular layer epitaxy apparatus that permits molecular layers to be formed each individually by epitaxial growth to form an inorganic, metallic or organic superstructure of such molecular layers, and that allows an efficient search for a substance to be conducted in a short period of time.

Another object of the present invention resides in providing a combinatorial molecular layer epitaxy apparatus that is capable of conveying wafers in their heated state, and permits successive processing chambers to be formed as independent vacuum chambers with pressure and temperatures therein controllable independently of one chamber from another.

DISCLOSURE OF THE INVENTION

In order to achieve the first object mentioned above, the present invention provides a combinatorial molecular layer epitaxy apparatus that comprises a common chamber having pressure therein controllable; one or more conveyable substrate heating units having a substrate holder for holding one or more substrates in the common chamber; and one or more process conducting chambers having pressure therein controllable and provided to correspond to the substrate heating units, the said process conducting chambers including a growth chamber which has a multiple raw material supply means for supplying raw materials onto a said substrate held by a said substrate heating unit, a gas supply means for feeding a gas onto a surface of the substrate, and an instantaneous observation means for instantaneously observing epitaxial growth of monomolecular layer for each of the layers on the substrate surface, thereby permitting growth temperature, pressure and supply of the raw materials to be controlled for each of the substrates and producing a group of substances caused each to grow epitaxially in an individual monomolecular layer and brought together in a single series of reactions for each of the substrates, systematically in accordance with indications of the instantaneous observation means.

The construction described above permits [multiple raw materials]×[multiple substrates]×[reaction parameters such as temperature, pressure and flux (rate of build-up) from gas phase] to be selected or controlled independently of one another and put together in any desired combination, and hence is capable of synthesizing or bringing together in a single series of reactions a group of substances into an epitaxial growth superlattice structure systematically controlled.

Also, in a combinatorial molecular layer epitaxial growth apparatus according to the present invention, the multiple raw material supply means preferably includes a laser molecular beam epitaxy means for vaporizing with an excimer laser beam a plurality of targets of different solid raw materials and for forming a thin film of a composition as aimed on each of the substrates.

This construction permits a limited depth of surface of a target to be momentarily vaporized and gasified and a thin film of a composition as aimed to be formed. It is possible to form a thin film, e. g., of an inorganic superstructure.

Also, in a combinatorial molecular layer epitaxial growth apparatus according to the present invention, the multiple raw material supply means may preferably include a laser molecular beam epitaxy means and a said substrates is composed of a material selected from the group which consists of $\alpha$-$Al_2O_3$, YSZ, MgO, $SrTiO_3$, $LaAlO_3$, $NdGaO_3$, $YAlO_3$, $LaSrGaO_4$, $NdAlO_3$, $Y_2O_5$, $SrLaAlO_4$, $CaNdAlO_4$, Si and compound semiconductors. Further, the target solid raw materials may include substances adapted to form a material selected from the group which consists of a high temperature superconductor, a luminescent material, a dielectric material, a ferroelectric material, a colossal magnetoresistance material and an oxide material.

This construction permits a target raw material to be consistently supplied to a substrate surface and makes the probability of adherence almost 1 regardless of a particular component. These features advantageously act in forming on a substrate a thin layer of monomolecular layers each individually caused to grow by epitaxial growth, of a high temperature superconductor, a luminescent material, a dielectric material, a ferroelectric material, or a colossal magnetoresistance material.

Further, in a combinatorial molecular layer epitaxy apparatus according to the present invention, the multiple raw material supply means may preferably include a target turn table supported to be rotatable and vertically movable for carrying targets, and a masking plate means disposed between said targets and said substrates and supported to be rotatable and vertically movable. Also, the masking plate means may preferably comprise a plurality of masking plates having different masking configurations which are exchangeable in succession while epitaxial growths are effected. Further, the masking plate means may comprise a mask movable horizontally with respect to said substrates and adapted to cover and uncover either or both of a said substrate and a given area thereof with said movable mask.

This construction with the aid of a movable mask caused to move to provide the mask plate means with masking patterns permits a superlattice thin films varied in composition or laminated structure to be prepared in a plurality of given areas of a substrate.

Also, in a combinatorial molecular layer epitaxy apparatus according to the present invention, the multiple raw material supply means may preferably comprise a laser molecular beam epitaxy means, and the instantaneous observation means may then comprise a reflex high-energy electron beam diffraction analysis means.

This construction permits providing a thin-filmed, for example, high melting point and multi-component oxide material while monitoring formation of layers each individually on epitaxial growth.

Further, a combinatorial molecular layer epitaxy apparatus according to the present invention may preferably further include a target loading lock chamber for loading targets with materials therein.

This construction permits exchanging targets in their clean state without exposing them to an environmental atmosphere.

Also, in a combinatorial molecular layer epitaxy apparatus according to the present invention, the multiple raw material supply means may preferably comprise a gas source molecular beam epitaxy means adapted to apply and thereby to supply a flow controlled stream of a gaseous organometallic compound through a nozzle means onto each of the substrates.

This construction permits forming, e. g., a metallic or organic structure by using a gaseous material such as of an organometallic compound.

Further, in a combinatorial molecular layer epitaxy apparatus according to the present invention, the multiple raw material supply means may preferably comprise a gas source molecular beam epitaxy means, and the instantaneous observation means may then comprise an optical means that makes observation based on any of reflectance differential spectroscopic, surface light absorbing and surface light interferometric processes.

This construction permits effecting an epitaxial thin film growth formation of a metallic or organic structure while monitoring monomolecular layers for each individual layer in growth.

Also, in a combinatorial molecular layer epitaxy apparatus according to the present invention, the substrates may preferably be substrates composed of Si or a compound semiconductor.

This construction permits forming a metallic or organic superlattice structure of monomolecular layers each individually caused to grow epitaxially, on Si and compound semiconductor made substrates.

Further, in a combinatorial molecular layer epitaxy apparatus according to the present invention, the substrates may preferably comprise substrates whose surfaces are made flat on an atomic level and whose outermost atomic layer is identified.

This construction provides the ability to observe RHEED oscillations that, for example, last with an extra-regularity and for a prolonged period of time, and thus permits ensuring epitaxial growth to proceed for each individual monomolecular layer Also, in a combinatorial molecular layer epitaxy apparatus according to the present invention, the common chamber may preferably be provided with a substrate holder loading lock chamber for exchanging the substrate holders in a state in which a high vacuum is held therefor.

This construction permits exchanging substrates in their clean state without exposing them to an environmental atmosphere.

Further, in order to achieve the second object mentioned above, a combinatorial molecular layer epitaxy apparatus according to the present invention has a said substrate heating unit adapted for a pressure contact with a said process conducting chamber to vacuum seal the same, the substrate heating unit and process conducting chamber then together forming an independently pressure controllable vacuum chamber.

This construction permits substrates to be transferred between the process conducting chambers in their heated state and makes the vacuum chambers pressure and temperature controllable independently of one from another.

Also, in a combinatorial molecular layer epitaxy apparatus according to the present invention, the substrate heating units may preferably be jointly adapted to be turned around and vertically moved by a carrier plate so as to be conveyed into association with said process conducting chambers in succession.

This construction permits the substrate heating units to move and turn along a given path or orbit and each to be transferred into association with a given process conducting chamber, and allows a substrate holder loaded with a number of substrates to be transferred into the process conducting chamber. It thus permits a plurality of process conducting chambers to conduct the processes in parallel.

Further, a combinatorial molecular layer epitaxy apparatus according to the present invention may preferably further include a shaft for revolution in the form of a tubular cylinder connected to an electric wiring and a service water piping outside of the common chamber and adapted to be turned and vertically moved in a state in which said common chamber means is held at vacuum, a cooling water piping disposed in a region of each of the substrate heating units and connected to the service water piping, and a carrier plate with its center disposed in coincidence with an axis of rotation of the shaft for revolution.

This construction permits a carrier plate to turn around the axis of rotation of the shaft for revolution continuously to allow the processes to be conducted in parallel, and prevents the cooling water piping for supply of cooling water into the substrate heating units and the electric wiring for power supply or a temperature monitoring thermo-couple from twisting.

Also, in a combinatorial molecular layer epitaxy apparatus according to the present invention, the shaft for revolution has preferably attached thereto, a slip ring adapted to vacuum seal an upper end of the shaft for revolution and to connect that upper end electrically to the external electrical wiring, a cooling water sealing means for connection to the external service water piping, and a cooling water conduit means connected water tight to the cooling water sealing means and having the shaft for revolution passed therethrough coaxially to permit said shaft to rotate in a sliding contact therewith.

This construction permits the carrier plate to be vertically moved and rotated by means of the shaft for revolution without producing a twist of a cooling water piping or the electrical wiring.

Further, in a combinatorial molecular layer epitaxy apparatus according to the present invention, the cooling water conduit means may preferably comprise an inner and an outer cooling water conduits disposed coaxially with the shaft for revolution and forming a single cooling water passage.

This construction permits supplying cooling water while holding the shaft for revolution moving vertically and rotating in its vacuum sealed state.

Also, in a combinatorial molecular layer epitaxy apparatus according to the present invention, a substrate heating unit may preferably include a substrate turning mechanism for rotating the substrate holder.

This construction improves temperature uniformity over a substrate by permitting the substrate holder to rotate.

Further, in a combinatorial molecular layer epitaxy apparatus according to the present invention, the substrate heating units may preferably be turnable and each include a substrate turning mechanism that provides a rotation from a driving power for turning around the substrate heating units.

This construction permits a single driving power to be used both to turn the substrate heating units and to rotate the substrate holder.

Also, in a combinatorial molecular layer epitaxy apparatus according to the present invention, a substrate heating unit may preferably include a substrate turning mechanism for rotating the substrate holder in a vacuum chamber.

This construction permits a substrate heating unit and a processing chamber together to form a vacuum chamber with pressure and temperature therein controllable, yet permitting the substrate holder to be rotated.

Further, in a combinatorial molecular layer epitaxy apparatus according to the present invention, the process conducting chambers may preferably include an annealing chamber for annealing substrates held by the substrate holder, a preheating chamber for preheating the substrates held by the substrate holder to a given temperature in a high vacuum, and a growth chamber for forming a thin film on a said substrate held by the substrate holder, and an etching chamber for etching a substrate with the thin film caused to grow and formed thereon.

This construction permits performing a plurality of processes in parallel consecutively.

Also, in a combinatorial molecular layer epitaxy apparatus according to the present invention, the substrate holder may preferably be formed with openings each in the form of a slit, arranged to surround one or more substrates.

This construction permits reducing an escape of the amount of heat from the substrate, and thus allows the substrate to be heated uniformly and efficiently.

Further, in a combinatorial molecular layer epitaxy apparatus according to the present invention, the substrate holder may preferably be in the form of a disk that is hollow inside and having its side wall formed with an annular groove that permits the substrate holder to be held on a substrate heating unit.

This construction permits easily loading the substrate holder into the substrate heating unit.

Also, in a combinatorial molecular layer epitaxy apparatus according to the present invention, the substrate holder may preferably comprise a holder ring having a stepped edge inside and having its side wall formed with an annular groove that permits the substrate holder to be held on a substrate heating unit, and a holder plate in the form of a disk to be seated on the stepped edge of the holder ring for supporting one or more substrate, the disk holder plate being formed of a material that is high in heat absorbing efficiency on its side facing the substrate heating unit.

This construction that allows the holder plate heated to contact only with the stepped edge of the holder ring permits reducing escape of the amount of heat by heat conduction and hence improves temperature uniformity over the holder plate.

Further, in a combinatorial molecular layer epitaxy apparatus according to the present invention, the holder plate formed of the material that is high in heat absorbing efficiency may preferably be constituted by an inconel plate with a surface region oxidated at a high temperature.

This construction permits effectively heating the holder plate.

Also, in a combinatorial molecular layer epitaxy apparatus according to the present invention, the substrate heating means comprises a lamp heater, the substrate holder and the holder plate being arranged to lie at a focusing position of the lamp heater.

This construction permits heat rays focused on the substrate holder and the holder plate to be effectively heated.

BRIEF DESCRIPTION OF THE DRAWINGS

The present invention will better be understood from the following detailed description and the drawings attached hereto showing certain illustrative forms of embodiment of the present invention. In this connection, it should be noted that such forms of embodiment illustrated in the accompanying drawings hereof are intended in no way to limit the present invention but to facilitate an explanation and understanding thereof.

BEST MODES FOR CARRYING OUT THE INVENTION

Figure 1:
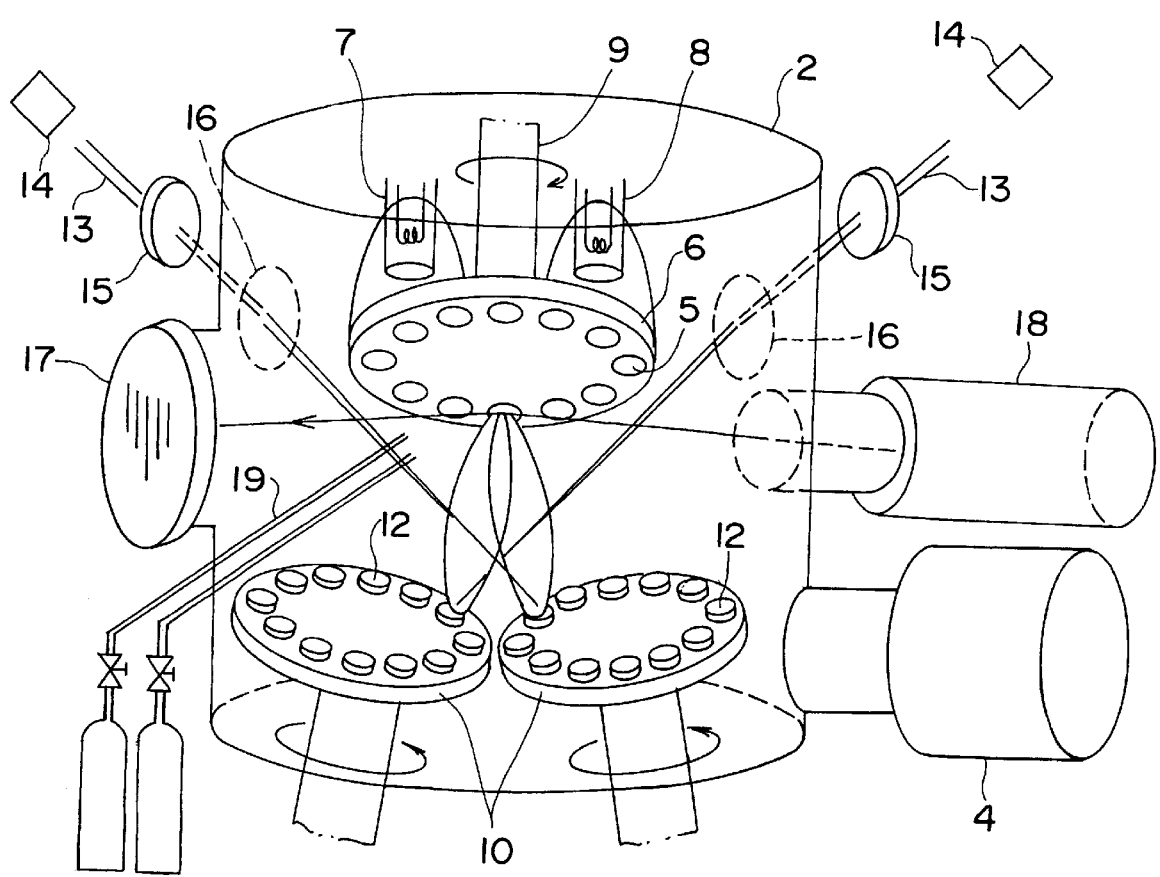
FIG. 1 is a diagrammatic view illustrating a combinatorial molecular layer epitaxy apparatus according to a first form of embodiment of the present invention.

Hereinafter, the present invention will be described in detail with reference to suitable forms of embodiment thereof illustrated in the drawing figures. While the present invention will hereinafter been set forth with respect to certain illustrative forms of embodiments thereof, it will readily be appreciated to be obvious to a person skilled in the art that many alternations thereof, omissions therefrom and additions thereto can be made without departing from the essences of scope of the present invention. Accordingly, it should be understood that the invention is not intended to be limited to the specific forms of embodiment thereof set forth below, but to include all possible forms of embodiment thereof that can be made within the scope with respect to the features specifically set forth in the appended claims and encompasses all the equivalents thereof.

A detailed description will first be given in respect of a first form of embodiment of the present invention that is typical for a combinatorial molecular layer epitaxy apparatus according thereto.

FIG. 1 is a diagrammatic view that depicts a combinatorial molecular layer epitaxy apparatus according to the first form of embodiment of the present invention. While a combinatorial laser molecular beam epitaxy apparatus is illustrated in FIG. 1 to constitute a thin film growth effecting apparatus, it can be substituted by a combinatorial gas source organometallic molecular beam epitaxy apparatus.

A combinatorial molecular layer epitaxy forming apparatus according to the present invention can be embodied as two alternative forms that differ partly in configuration depending on raw materials supplied and material components to be prepared, i. g., as a combinatorial laser molecular beam epitaxy apparatus in which a raw material in solid state is gasified by a pulsed laser beam to allow molecular layers to grow epitaxially for each of the molecular layers, and which thus is suitable to combinatorially synthesize an inorganic superstructure, and a combinatorial gas source organic metal molecular beam epitaxy apparatus which using a raw material in a gaseous or gasified state, e. g., of an organometallic compound, is suitable to form an metallic or organic superstructure by permitting molecular layers to grow epitaxially for each of the molecular layers. The two apparatus forms may be identical to each other but for different manners of supplying raw materials.

First, an explanation is given in respect of a combinatorial laser molecular beam epitaxy apparatus.

Referring to FIG. 1, a combinatorial laser molecular beam epitaxy apparatus according to this form of embodiment includes a vacuum chamber 2, an ultra-high vacuum pump 4 such as a turbo-molecular pump, an ion pump or a cryopump for evacuating the vacuum chamber 2 via a gate valve (not shown) to a high vacuum, a substrate holder 6 rotatable for holding a plurality of substrates 5, and a lamp heater 8 disposed in a rear side of the substrate holder 6 for heating the substrates.

The apparatus also includes a rotatable shaft 9 that supports the substrate holder 6, rotatable target tables 10 and 10 juxtaposed with or opposed to the substrate holder 6, a plurality of different solid raw material targets 12 loaded on these target tables 10 and 10, light sources 14 and 14 for excimer laser beams 13 and 13 for gasifying these raw material targets 12, lenses 15 and 15 for focusing these laser beams, windows 16 and 16 for introducing the laser beams into the vacuum chamber 2, an electron gun 18 for reflex high-energy electron diffraction (hereinafter referred to as "RHEED") analysis for impromptu or instantaneously [in the sense occurring at a particular instant] monitoring epitaxial growth of a molecular layer on a thin film forming substrate, and a screen 17 for RHEED analysis.

A control unit is further included but not shown, which is used to control the home positions and rotational angular positions of the substrate holder 6 and the target tables 10 and 10. The control unit is provided also to select particular types of targets for, and in conjunction with, a particular substrate on which growth is to be effected, and further to control a pulse duration of the pulsed irradiating excimer laser.

The ultra-high vacuum pump 4 should desirably have a capability to keep the vacuum chamber 2 at a pressure in the order of $10^{-10}$ Torr. Also, the vacuum chamber 2 is designed to have its pressure controllable by adjustment of the opening of a valve (not shown). It should further be noted that the ultra-high vacuum pump is provided with a rotary pump as an assistant pump.

A substrate 5 when lying at a position where it has a thin film growing thereon is heated by the lamp heater 8 and elsewhere it is heated by a preheating or after-heating lamp heater 7. These lamps are disposed in the neighbourhood of the substrate holder 6. Optionally, a lamp heater may be disposed in the substrate holder itself in which case it is made adjustable to heat a substrate at a thin film growing position to a growth temperature and to warm it elsewhere at a given temperature.

While in the form of embodiment shown in FIG. 1 common use is made of the single vacuum chamber for the purpose of effecting thin film growth and for the preheating or post-heating purpose, individually a chamber for effecting growth of thin films on substrates and a chamber for preheating or post-heating the substrates may be provided separately and independently as disposed adjacent to each other.

The vacuum chamber in addition to having an atmospheric air inlet means for restoring to a normal pressure is associated with a gas feed system including nozzles 19 for feeding oxygen, nitrogen and other reactive gases for effecting epitaxial growth of high temperature superconductor related oxides. In this connection, it should be noted that the gas feed system is only roughly depicted in FIG. 1, and normally has its operations controllable by mass flow meters and also controllable in cooperation with the vacuum pump system.

To mention further, for the substrates use may be made of $\alpha$-$Al_2O_3$, YSZ, MgO, $SrTiO_3$, $LaAlO_3$, $NdGaO_3$, $YAlO_3$, $LaSrGaO_4$, $NdAlO_3$, $Y_2O_5$, $SrLaAlO_4$, $CaNdAlO_4$, Si and compound semiconductors.

By the way, in order to detect RHEED oscillations based on a molecular layer epitaxial growth effected, and yet to permit the molecular layer epitaxial growth to continue while monitoring the RHEED oscillations, it is extremely important to make flat the surface of a substrate on a atomic level and to identify an outermost atomic layer.

For example, as regards a perovskite oxide that is expressed by a general formula of $ABO_3$ in which an atomic layer of AO and an atomic layer of $BO_2$ are repeated, which if AO, $BO_2$ or both AO and $BO_2$ coexistent forms the uppermost surface makes a difference in the mode in which a film grows thereon.

For instance, a polished $SrTiO_3$ substrate has its uppermost surface composed mainly of $TiO_2$ with a surface roughness of several nanometers. Wet etching such a $SrTiO_3$ (100) substrate in a $HF/NH_3$ buffer solution (pH=4.5) makes its surface flat on an atomic level and allows its outermost atomic layer to be formed by a $TiO_2$ layer.

A substrate with its surface made flat on an atomic level lends itself to detection of RHEED oscillations caused by a growth of an individual molecular layer.

Accordingly, this form of embodiment preferably uses a substrate with its surface made flat on an atomic level and with its outermost atomic layer specified.

The target solid material can be any material whatsoever that is in a solid state for use. Such usable materials include high temperature superconductors such as $YBa_2Cu_3O_7$, luminescent materials such as ZnO, (ZnMg)O, (ZnCd)O, dielectric or ferroelectric materials such as $SrTiO_3$, $BaTiO_3$, PZT and $(SrBa)TiO_3$, and colossal magnetoresistance materials such as $(LaSr)MaO_3$.

Further, use can be made of a single or multiple component oxide for supply of each individual component.

Next, an explanation is given in respect of an operation of forming a thin film with a combinatorial laser molecular beam epitaxy forming apparatus.

For example, pressure in the vacuum chamber 2 is controlled to be in the order of $10^{-4}$ Torr, a substrate 5 is heated by the lamp heater 8 to a growth temperature of, e. g., 850° C., and the substrate holder 6 is rotated or turned to locate the substrate 5 at a growth position. The target tables 10 and 10 are rotated or turned to locate targets 12 and 12 to given positions where they are opposed to the substrate. The targets 12 and 12 are irradiated with excimer laser beams 13 and 13, e. g., pulsed, for a given period of time.

The excimer laser beams impinging upon the targets will bring about on their surfaces both an abrupt build-up of heat and photo-chemical reactions and cause raw materials to be explosively gasified, forming on the substrate a thin film composed as aimed. Then, the RHEED analyzer capable of observing at a mirror reflection spot thereof, oscillations that follow a repetition of nucleus formation and flattening for each layer, strictly monitoring a thickness of the film self-controllable for each individual monomolecular layer.

After epitaxial growth of a substance forming the thin film with the monomolecular layer on the substrate 5, the target tables 10 and 10 are turned to locate the other targets 12 and 12 at those given positions to cause a thin film of superstructure of another substance.

After preparing an artificial crystal or superlattice having a novel lattice structure on the one given substrate, the substrate holder 6 is turned for processing of a next substrate.

If an epitaxial growth film is of a superconductor, the oxygen partial pressure in the vacuum chamber 2 of a reaction system is raised to meet with required oxidation conditions. In this connection, it should be noted that this form of embodiment of the invention offers an extended pressure reducibility and allows the oxygen partial pressure to be controlled in an extended range.

Thus, a combinatorial laser molecular beam epitaxy apparatus according to this form of embodiment of the invention permits [multiple raw materials]×[multiple substrates]× [reaction parameters such as temperature, pressure and flux from gas phase] to be controlled or selected independently of one another and put together in any desired combination, and hence is capable of producing a group of substances brought together or synthesized in a single series of reactions into a structure systematically controlled.

An explanation is next given in respect of a combinatorial gas source organometallic molecular beam epitaxy apparatus.

To this end, reference is made to FIG. 1 which was used to illustrate a combinatorial laser molecular beam epitaxy apparatus as above described, but has a structure much common to a gas source specie of embodiment of the invention as well.

Referring to FIG. 1, a combinatorial gas source organometallic molecular beam epitaxy apparatus according to this form of embodiment includes a vacuum chamber 2, and a vacuum evacuation system including an ultra-high vacuum pump 4 such as a turbo-molecular pump, an ion pump or a cryopump for evacuating the vacuum chamber 2 via a gate valve (not shown) to a high vacuum.

The apparatus also includes a substrate holder 6 rotatable for holding a plurality of substrates 5, and a lamp heater 8 disposed in a rear side of the substrate holder 6 for heating the substrates, a rotatable shaft 9 that supports the substrate holder 6 and the lamp heater 8, and nozzles 19 that apply flow controlled streams of a plurality of reactive gases as raw materials such as organometallic compounds onto a substrate. Control of gas flows, their introductory on/off operations, and/or introductory timings may be effected ganged with control of vacuum evacuation.

Also in the combinatorial gas source organometallic molecular beam epitaxy apparatus in which raw materials are gas source organometallic compounds and adsorptive surface reactions are controlling, it is effective to employ a laser beam as instantaneous observation means for instantaneously monitoring epitaxial growth of an individual molecular layer and thus to irradiate the layer growing with a laser beam and monitor changes in intensity of the laser beam.

For monitoring epitaxial growth of each individual molecular layer, there may be utilized, for instance, a reflectance differential spectroscopic method in which a linearly polarized light is used for incidence on a substrate at a right angle thereto and anisotropy of a surface structure of the layer in growth is detected from characteristics of the reflected light, or a surface light absorption or surface light interferometric method that determines changes in the intensity of the reflected light from changes in light absorption or optical phase caused by surface adsorbed atoms or molecules.

To mention further, for the substrates use may be made of a compound semiconductor material composed of elements of, e. g., III to V groups, II to V groups, I to VII groups, II to IV groups and IV to VI groups in any of a variety of possible combinations. Further, in place of such a compound semiconductor, the substrates may be Si (silicon) substrates.

A combinatorial gas source organometallic molecular beam epitaxy apparatus permits monomolecular layers to grow epitaxially for each of the layers growing upon monitoring and hence is capable of producing a group of substances brought together or synthesized in a single series of reactions into a structure systematically controlled, here again.

An explanation will next be given in respect of a combinatorial molecular layer epitaxy apparatus of the present invention that is implemented in a second form of embodiment thereof.

Figure 2:
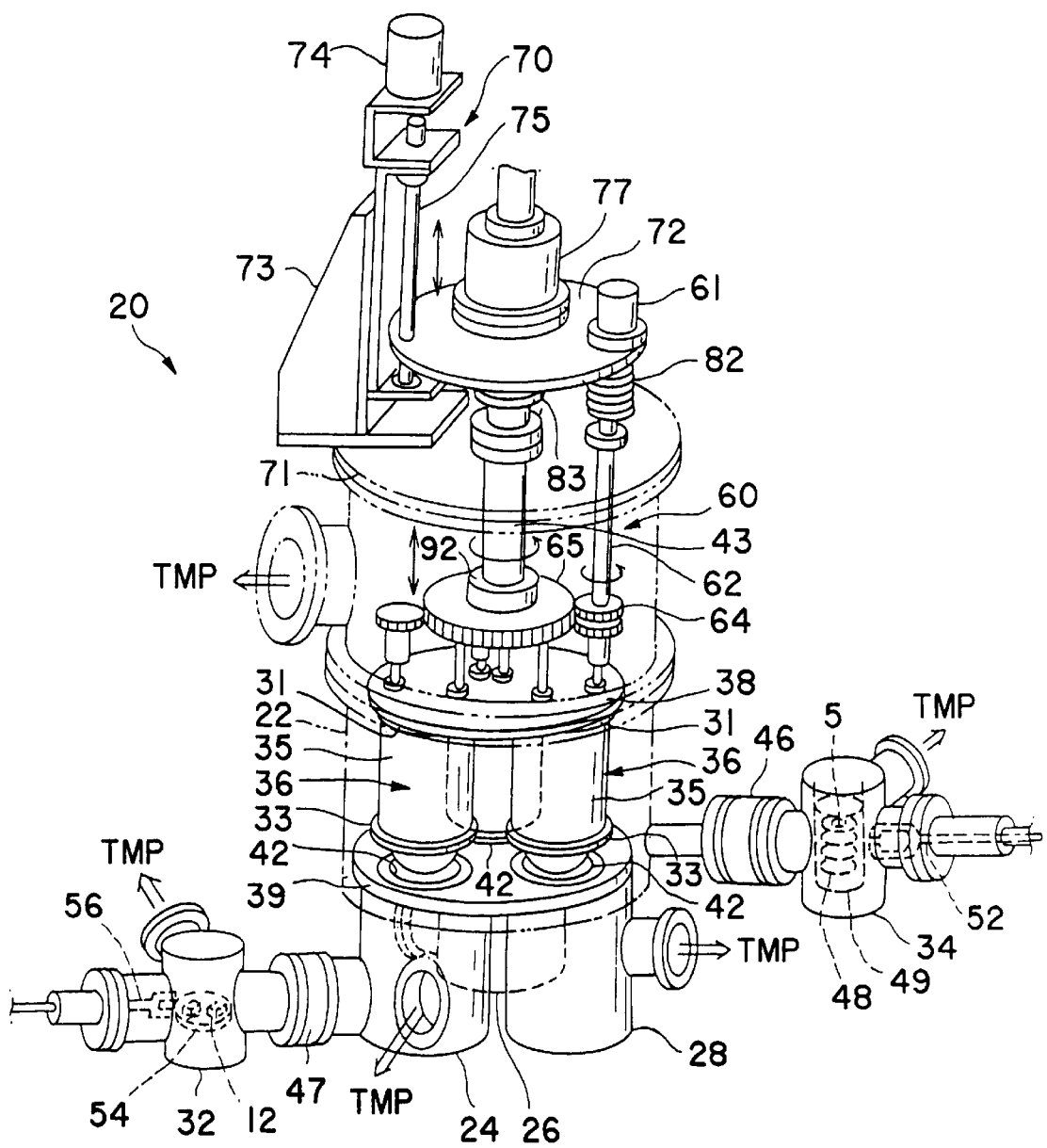
FIG. 2 is a view of appearance that illustrates a combinatorial molecular layer epitaxy apparatus according to a second form of embodiment of the present invention.

FIG. 2 is a view of appearance that illustrates a combinatorial molecular layer epitaxy apparatus according to a second form of embodiment of the present invention.

A combinatorial molecular epitaxy apparatus 20 that represents the second form of embodiment includes a common chamber 22, and a plurality of processing chambers that include a growth chamber 24, an annealing chamber 26, a preheating chamber 28 and a substrate holder load locking chamber 34. These chambers 22, 24, 26, 28 and 30 are each vacuum shielded or sealed individually, forming vacuum chambers evacuated to a high vacuum independently of one another.

In the common chamber 22, the processing chambers constituted by the growth chamber 24, the annealing chamber 26 and the preheating chamber 28 are vacuum shielded or sealed by and on conveying with a carrier plate 38 a substrate heating unit 36 mounted thereto into each of those processing chambers 24, 26 and 28, and then locking them.

The growth chamber 24 provides a stage in which a thin film is caused to grow on a substrate, the annealing chamber 26 a stage in which a substrate with a thin film formed is annealed, and the preheating chamber 28 a stage in which a substrate is cleaned and preheated in a high vacuum atmosphere.

While the present forms of embodiment are thus shown and described to conduct three processes successively in these stages, it can be seen that additional stages such as for conducting processes of etching and doping a given area of the substrates. Then, five independent vacuum chambers come to be included.

Character "TMP" in FIG. 2 stands for a turbo molecular pump, typically with a rotary pump as an assistant pump, and by which each of the processing chambers is evacuated to an ultra-high vacuum, via a gate valve unit (not shown).

Each of the vacuum chambers also has pressure therein controllable by a valve unit (not shown) with a valve opening adjustable and may be provided with a further valve unit and a mass flow meter (not shown) to permit oxygen or dry nitrogen to be admitted in a flow adjusted.

The common chamber 22 is made to communicate with the growth chamber 24, the annealing chamber 26 and the preheating chamber 28 via openings 42, 42, 42 formed in a partition 39 each of which has around it an annular groove in which an O-ring 41 is fitted. Further, the growth chamber 24, the annealing chamber 26 and the preheating chamber 28 are each vacuum sealed or shielded and held fixed to the partition 39.

Figure 4:
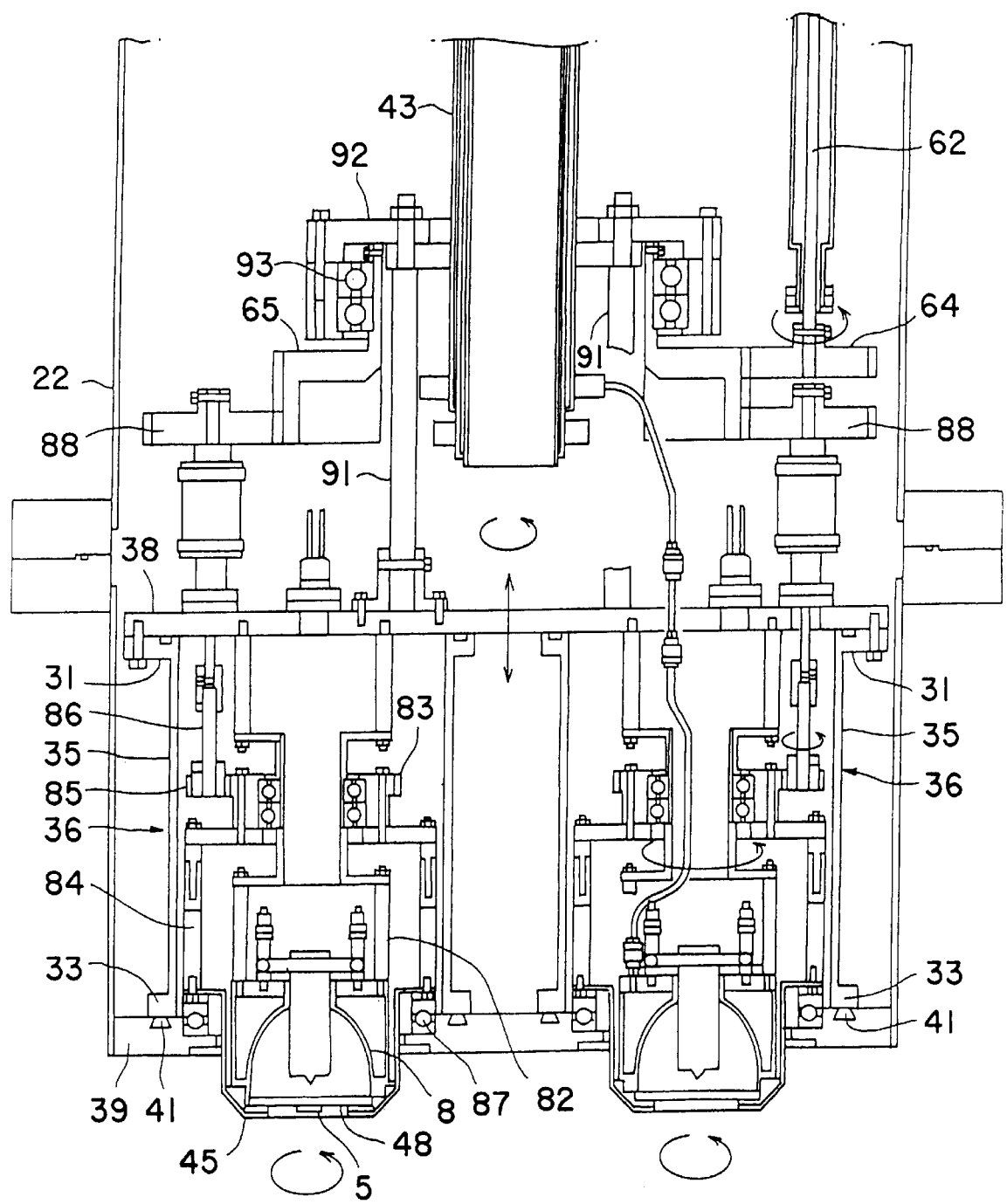
FIG. 4 is a detailed cross sectional view that shows a substrate heating unit according to the second form of embodiment of the present invention, depicting a state thereof in which a carrier plate has been moved to its lower end in pressure contact with a partition.

In FIG. 2 three substrate heating units 36 are shown in the common chamber 22, each accommodated in a cylindrical housing 35 which also accepts a substrate holder 48 and a chuck 45 therefor as well as a lamp heater 8 of the substrate heating unit 36 (see FIG. 4).

These substrate heating units 36 are each vacuum shielded or sealed at a flanged upper end 31 of the cylindrical housing 35 to, and are carried by, the carrier plate 38 for both rotary conveyance and vertical movement by a shaft 43 for revolution.

The shaft for revolution 43 is made to rotate by a rotational drive mechanism 60 and to vertically move by a translational movement drive mechanism 70, both in a state in which the common chamber 22 remains vacuum shielded or sealed.

The housing 35 has its lower end flanged 33 as well which when the carrier plate 38 reaches its end position is placed in pressure contact with the O-ring 41 (FIG. 4) fitted in the annular groove around the opening 42 in the partition 39 to make the housing 35 vacuum shielded or sealed in isolation from the common chamber 22. Then, the substrate heating units 36, 36 and 36 and the processing chambers constituted by the growth chamber 24, the annealing chamber 26 and the preheating chamber 28 are designed to be evacuated and to have pressure therein controlled, and to be heated to respective temperatures given, independently of one another.

As shown in FIG. 2, the substrate holder loading lock chamber 34 is attached via a gate valve 46 to the common chamber 22 and has a stock housing 49 disposed therein which carries a plurality of substrate holders 48 each loaded with substrates 5. The substrate holder loading lock chamber 34 is also provided with a clip member 52 that is externally operable to transfer a substrate holder 48 out of the chamber 34 into the common chamber 22 in the state in which the chamber 34 is held at high vacuum, for reception by a chuck 45 in the substrate heating unit 48.

The growth chamber 24 is identically constructed itself to that in the combinatorial laser molecular beam epitaxy apparatus shown in FIG. 1 except that only one lamp heater is here provided therefor.

Further, it should further be noted that in a laser molecular beam epitaxy as shown in FIG. 2, a target loading lock chamber 32 is attached via a gate valve 47 to the growth chamber 24 and has a plate 54 disposed therein which carries a plurality of targets 12. The target loading lock chamber 32 is associated with a clip member 56 which is externally operable to transfer a target 12 out of the chamber 32 onto a target plate (not shown) in the state in which the chamber 32 is held at high vacuum.

Mention is next made of details of a growth chamber.

Figure 3:
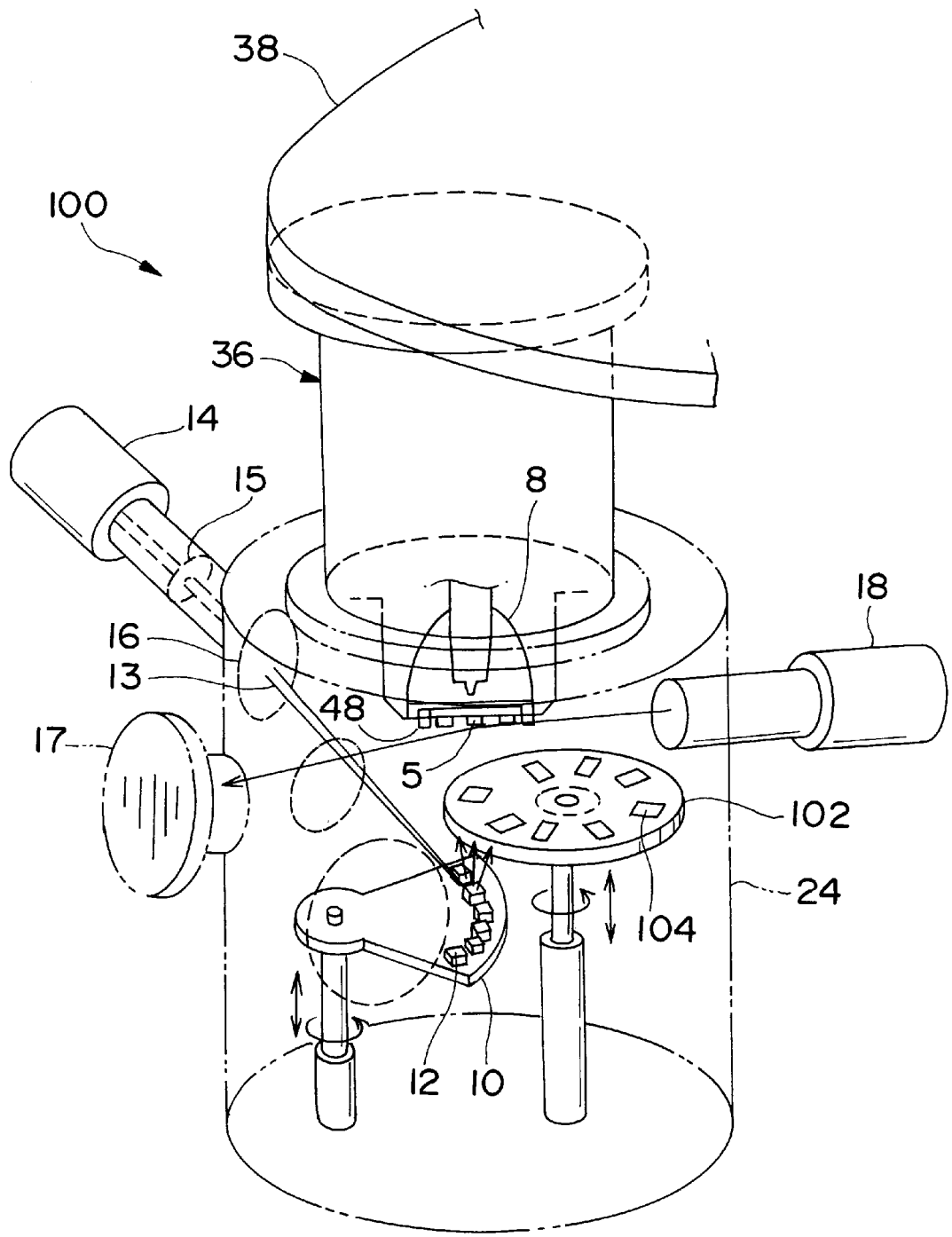
FIG. 3 is a view of appearance that illustrates an essential portion of a growth chamber in a combinatorial molecular layer epitaxy apparatus according to the second form of embodiment of the present invention, depicting an independent vacuum chamber comprising a substrate heating unit and a growth chamber.

FIG. 3 is a view of appearance that illustrates essential portions of a growth chamber in a combinatorial laser molecular beam epitaxy apparatus, depicting an independent vacuum chamber constructed of a substrate heating unit and a growth chamber.

As shown in FIG. 3, a vacuum chamber 100 comprising a substrate heating unit 36 and a growth chamber 24 is set up with the substrate heating unit 36 brought in pressure contact with a partition (illustration omitted). A plurality of substrates 5 is shown as held by a substrate holder 48 that is carried rotatably and mounted to a substrate holder rotational drive unit 84 (shown in FIG. 2).

The growth chamber 24 is provided therein with a rotatable target table 10 disposed as opposed to the substrate holder 48, and a masking plate 102 placed between the substrate holder 48 and the target table 10. The masking plate 102 has different masking patterns formed therein, e. g., of eight types.

While the masking plate is shown to be disk shaped, it may as an alternative be in the form of a shutter with shutter plates movable from opposite sides. Then, such a masking plate is carried so as to be both rotatable and movable vertically up and down.

A plurality of targets of different solid raw materials are loaded on the target table 10. The apparatus further includes a light source or laser 14 for an excimer laser beam 13 for vaporizing a target material 12, a lens 15 for focusing the laser beam, a window 16 for admitting the laser beam into the vacuum chamber 100, an electron gun 18 for reflex high-energy electron diffraction (hereinafter referred to "RHEED") analysis, and a screen 17 for RHEED.

The target table 10 and the masking table 102 are each carried so as to be both rotatable and vertically movable up and down in the state of holding the pressure of the growth chamber 24, and are provided with target table rotational and translational movement drive mechanisms and masking plate rotational and translational movement drive mechanisms, respectively.

Use is made, especially for the masking rotational drive mechanism, of a stepping motor precision driven to permit a thin film to grow with a controlled film thickness in a preselected area.

The growth chamber 24 is also provided with an atmospheric air or nitrogen admitting system for restoring to a normal pressure, and a gas supply system for oxygen and reactive gases fed onto a substrate through nozzles when a high temperature superconductor oxide epitaxy is to be effected (neither system shown).

Further, the home position and the angular displacement of each of the substrate holder 48, the masking plate 102 and the target table 10 rotated or turned is made controllable by a control unit not shown. Specifically, the control unit is made to act on their respective rotational drive mechanisms so as to allow a particular type of target material and a particular type of masking pattern 104 to be selected for a given substrate on which and at a given position of which a thin film is intended to grow, to allow an epitaxial growth for each individual molecular layer to be instantaneously monitored through RHEED analysis, and to allow the duration of a pulsed irradiating excimer laser beam to be controlled in accordance with such instantaneous monitoring.

An explanation is next given of an operation of the combinatorial laser molecular beam epitaxy apparatus according to the second form of embodiment described, in the process of forming a thin film on a substrate.

With reference to FIG. 3, pressure in the vacuum chamber 100 is controlled to a high vacuum in the order of, e. g., $10^{-4}$ Torr. A given substrate 5 is positioned at a growth position by rotating the substrate holder 6, or while it is heated by the lamp heater 8 to a growth temperature, e. g., 850° C. To correspond to this particular substrate, a particular masking pattern is selected through the masking plate rotating drive mechanism. A target 12 so as to be opposed to the substrate at its growth position is located at a given corresponding position by turning the target table 10, and the target 12 is then irradiated with an excimer laser beam, e. g., pulsed, for a predetermined period of time. Post-processing processes are the same as in the first form of embodiment previously described.

The operation described above may be used to effect a given combinatorial synthesis on a plurality of substrates with a fixed masking pattern. If a plurality of thin films that are different in composition are to be formed on a plurality of given areas of a substrate or superlattices with varying laminar structures are to be prepared on a substrate, the masking plate may successively be displaced to bring different masking patterns into position to cover and uncover given areas on the substrate. Further, above mentioned masking is possible by using the shutter plates to cover and uncover given areas on the substrate.

The combinatorial laser molecular beam epitaxy apparatus according to the present form of embodiment thus permits [multiple raw materials]×[multiple substrates]×[reaction parameters such as temperature, pressure and flux from gas phase] to be selected or controlled independently of one another and put together in any desired combination, and hence is capable of synthesizing or bringing together a group of substances in a single series of reactions into a structure systematically controlled.

Yet, it should be noted that while the growth chamber is described above for combinatorial laser molecular beam epitaxy, the growth chamber for gas source molecular beam epitaxy is modified to include means for applying through a nozzle onto each substrate a gas source organometallic compound in a controlled flow as the multiple raw material supply means for supplying a film composing raw material onto a substrate at a growth position in the substrate holder. Such a modification represents the construction shown and described for the first form of embodiment.

FIG. 4 is a detailed cross sectional view that shows a substrate heating unit according to the second form of embodiment of the present invention, depicting the carrier plate having been moved to its end position to place the substrate heating unit in contact with the partition.

As shown in FIG. 4, the substrate heating unit 36 includes a cylindrical housing 35 having its opposite ends flanged 31 and 33, a lamp holder 82 disposed across the center line of the housing 35, and a lamp heater 8 mounted on the lamp holder 82 as well as a substrate turning mechanism for rotating the substrate holder.

The lamp heater 8 needs to be cooled to ensure its safety and temperature control stability. To this end, the lamp heater has a water cooling pipe line 201 led from the substrate heating unit and connected, via a bulk head union 203 vacuum sealed to the carrier plate 38, to a cooling water circulation piping assembly 200 disposed to encircle the shaft for revolution 43 and having cooling water supply and return pipe lines 202 and 202.

For the lamp heater an electrode plug 101 is provided as vacuum sealed to the carrier plate 38. Although not shown here but will be described later in detail, an electric power supply wiring for the lamp heater 8, signal lines for temperature control thermo-couples and so forth for the lump heater are lead to run through the inside of the shaft for revolution 43 and lead to its outside as vacuum sealed.

The substrate revolving mechanism includes a substrate holder rotating member 84 arranged outside of the lamp holder 82, and a chuck 45 mounted on the rotating member 84 for positioning the substrate holder 48 at a focal point provided by the lamp heater 8.

The substrate holder rotating member 84 includes at its upper end a gear for rotation 83 in mesh with a gear 85 fastened to one end of a shaft for rotation 86 which has at its other end a gear for rotation 88 in mesh with a gear for revolution 65. Further, the substrate holder rotating member is provided at its lower end with a bearing 87.

Mention is next made of a substrate holder.

FIGS. 5(a) and 5(b) illustrate a substrate holder in a perspective view of appearance and in a cross sectional view, respectively. FIG. 5(b) also depicts an orientation of the substrate holder relative to the lamp heater 8.

Figure 5:
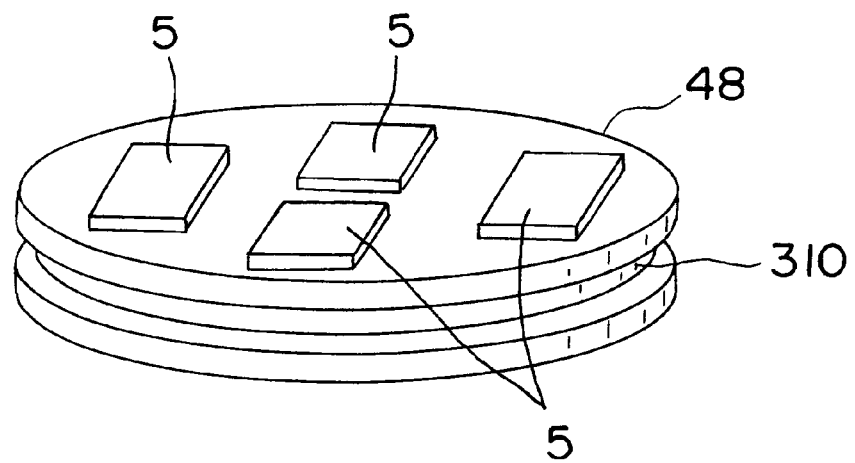
FIGS. 5(a) and 5(b) are a perspective view of appearance and a cross sectional view, respectively, that illustrate a substrate holder.
Figure 5:
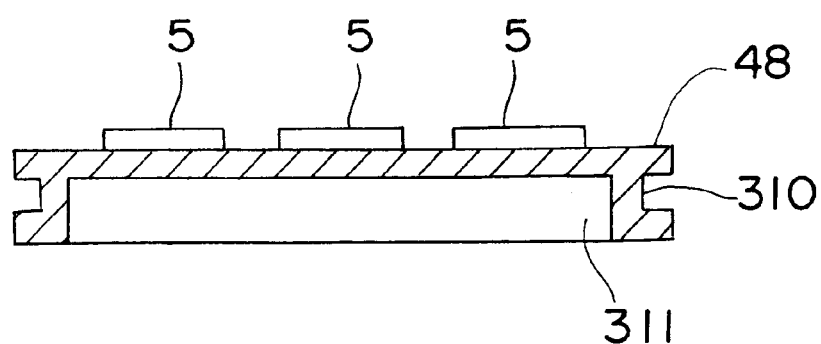
Figure 5:
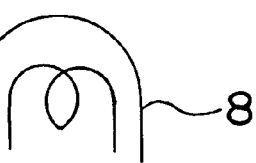

Referring to FIG. 5, the substrate holder shown is in the form of a disk formed with a hollow interior 311 and laterally having an annular recess 310 to hold the substrate holder in the chuck 45. On a surface of the substrate holder at its side opposite to its hollow or bottom open side are mounted a plurality of substrates 5. The hollow and bottom open interior is provided to have a suitable depth such as to allow the substrates to be effectively heated and yet to an extent sufficient to prevent deformation of the substrate holder. Further, while substrates are shown mounted as plural in number, it should be noted that only one substrate may be mounted. If a plurality of substrates are mounted, it is preferred that they be arranged along a circle or circles on the disk surface around its center.

Such a substrate holder with a moderately hollow interior prevents deformation of its body portion, yet permitting effective heating of substrates.

Figure 6:
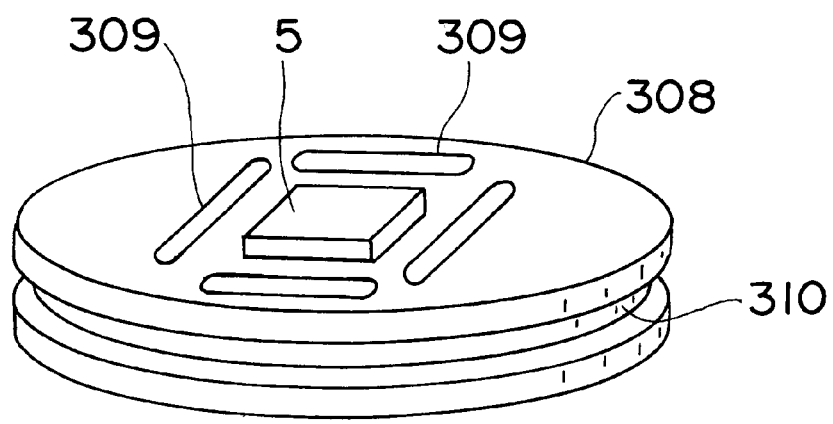
FIGS. 6(a) and 6(b) are a perspective view of appearance and a cross sectional view, respectively, that illustrate a modification of that substrate holder.
Figure 6:
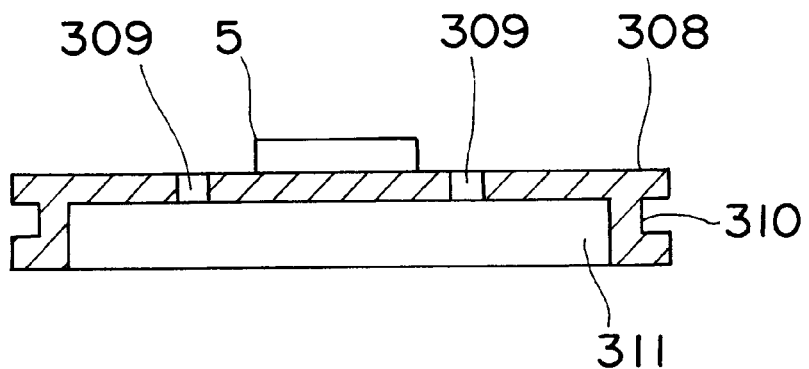
Figure 6:
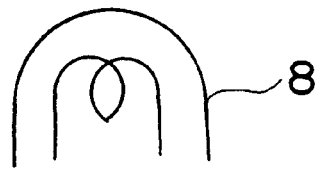

FIGS. 6(a) and 6(b) illustrate a substrate holder that represent a modification of the substrate holder of FIGS. 5(a) and 5(b), in a perspective view of appearance and in a cross sectional view, respectively. FIG. 6(b) also shows the lamp heater 8.

As shown in FIGS. 6(a) and 6(b), a modified substrate holder 308 is formed with a plurality of openings 309 in the form of slits arranged so as to surround a disk's central area in which a substrate 5 is placed. With such a substrate holder 308, a substrate 5 is heated by focusing heat rays emitted by the lamp heater 8 on an substrate holder surface area on which the substrate 5 is supported. While the substrate is heated by heat conduction in a portion of the substrate holder defined by the slit openings 309, presence of these openings 309 is found to reduce escape away from that portion of heat conducted. Further, it should be noted that substrates need not be singular but may be plural. If a plurality of substrates are mounted, slit openings 309 may be formed either just to surround, or around, them.

Such a substrate holder 308 permits one or more substrates to be heated effectively and increases evenness of heating temperature.

Figure 7:
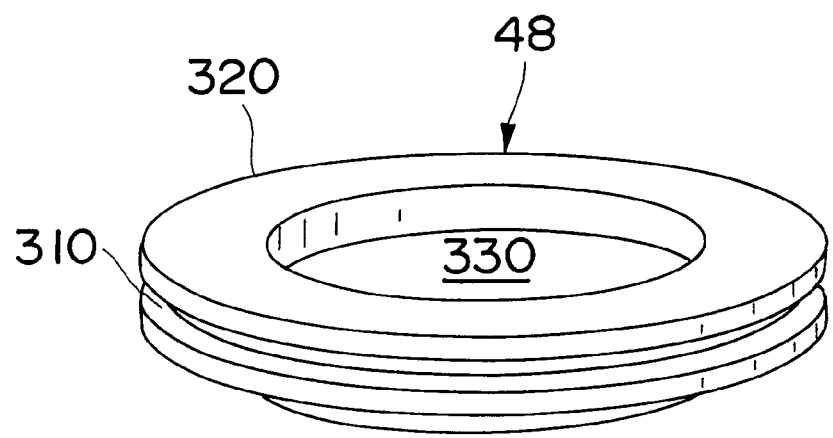
FIGS. 7(a) and 7(b) are a perspective view of appearance and a cross sectional view, respectively, that illustrate an alternative substrate holder.
Figure 7:
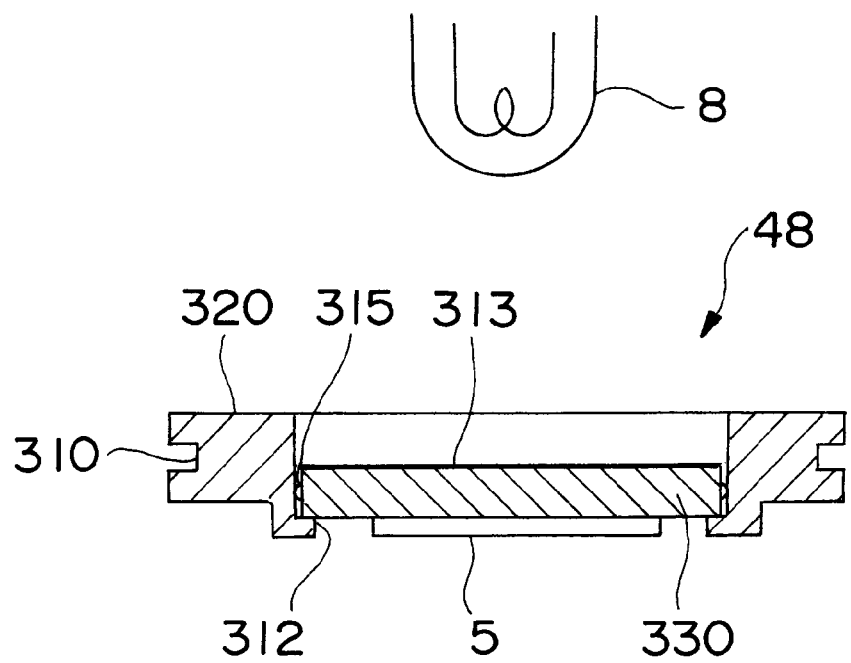

FIGS. 7(a) and 7(b) shows an alternative form of the substrate holders described above, in a perspective view of appearance and in a cross sectional view, respectively. FIG. 7(b) also depict an orientation of the alternative substrate holder relative to the lamp heater 8.

Referring to FIGS. 7(a) and 7(b), the alternative substrate holder 48 includes a holder ring 320 having its outer peripheral wall formed with an annular recess 310 for holding the substrate holder in a chuck 45 and its inner peripheral wall ending with an inner stepped edge or shoulder portion on which a holder plate 330 is seated inside of the holder ring 320 and in contact with an extremely limited area.

Such a substrate holder 48 when attached to the chuck 45 is so oriented as to place the holder place 330 at a focal area of heat rays emitted by the lamp heater. It should be noted further that the holder plate 330 may be formed on its side wall with minute projections 315 having rounded ends so it can be fitted snugly in the holder ring 320.

Also, the holder plate 330 is advantageously formed of a material that is high in heat absorbing efficiency. Further, an oxidated or oxide material is formed on the disk surface facing the lamp heater 8 to maximize the heat absorbing efficiency of the holder plate 330. For example, if the lamp heater is constituted by an infrared heater, it is desirable that the holder plate be formed of -inconel and then have its surface oxidated at a high temperature around 1000° C. to form an oxide 313 colored in black so it has a maximum heat absorbing efficiency.

A substrate holder so constructed allows its holder plate to be heated by a lamp heater at a maximum heat efficiency and minimizes escape from the peripheral area of the holder plate of heat conducted. Accordingly, it has the effect of rendering the holder plate temperature uniform.

An explanation is next given in detail in respect of a rotational drive mechanism for rotating the carrier plate and a translational movement drive mechanism for translationally moving the carrier plate vertically.

Referring to FIG. 2, a rotational drive mechanism 60 for rotating the carrier plate 38 is shown to include a motor 61 mounted on a translational movement plate 72, a shaft 62 for transmission of a driving power of the motor 61, and a drive gear 64 attached to an end portion of the shaft 62. The drive gear 64 is in mesh with the gear for revolution 65 provided for the revolution shaft for transmission of the rotational driving power thereto.

It should be noted further that the rotational shaft 62 is made to pass through the inside of a flexible tube 82 included to provide a vacuum shield between the movement table 72 and the growth chamber 22.

Referring to FIGS. 2 and 4, the shaft for revolution 43 has at its end portion a support member 92 fixed thereto that fixes the carrier plate 38 thereto by means of a plurality of holder shafts 91. And, the gear for revolution 65 is coupled to the support member 92 to be rotatable relative thereto at a given torque via a bearing 93.

Referring to FIG. 2, the translational movement drive mechanism 70 includes a bracket 73 secured to an upper cover or top 71 of the common chamber 22, a rotary shaft 75 coupled to a motor 74 so as to be rotationally driven thereby, and the translational movement plate 72 to be moved translationally in vertical directions as the rotary shaft 75 is rotated. The shaft for revolution 42 extends through the inside of a flexible tube 83 included to provide a vacuum shield or seal between the translational movement plate 72 and the growth chamber 22, is magnetically shielded by a magnetic shielding unit 77 mounted on the translational movement plate 72, and is rotatably supported thereby. The magnetic shielding unit here is provided to vacuum shield the shaft for revolution by means of a magnetofluid.

Next, mention is made of an operation, first of the translational movement drive mechanism.

Referring to FIGS. 2 and 4, when the translational movement plate 72 is placed at an upper starting position, the rotary shaft 75 is rotated by the motor 74 to cause the plate 72 to descend. Then, the flexible tubes 82 and 83 are going to shrink. As the plate 72 descends, the shaft for revolution 43 will descend. And, a continued descent of the shaft for revolution 43 will bring the flange 33 of the substrate heating unit 36 attached to the conveying plate 38 into pressure contact with the O-ring 41, the substrate heating unit thus coming to a halt.

Thus, each of the vacuum chambers is vacuum shielded or sealed to the substrate heating unit 36, then permitting them to be independently evacuated and pressure controlled, and to be each heated to a given temperature.

An explanation is next given in respect of operations of the conveying plate and the substrate revolving drive mechanism.

Referring to FIGS. 2 and 4, when the translational movement plate 72 lies at its upper starting position, a rotational driving power provided by the motor 61 is transmitted to the shaft 62 to rotate the drive gear 64. The drive gear 64 when rotated rotates the gear for revolution 65 and in turn the shaft for revolution 43, causing the carrier plate to rotate and thereby revolving the substrate heating unit 36. Then, the grear for rotation 88 is caused to rotate, transmitting rotational drive via the rotary shaft 86 to the rotary gear 83 to turn the substrate holder rotating member 85 and thus to rotate the substrate holder 48. It should be noted in this conneciton that each of the shaft for revolution 43, the rotary shaft 62 and the rotary shaft 86 are caused to rotate in the state in which each is vacuum shielded or sealed in its respective vacuum chamber.

Therefore, not only is it possible to convey the substrate heating unit at the carrier plate to any given one of the vacuum chambers but it is also possible to rotate the substrate holder 48.

When the carrier plate 38 have been translationally moved to its lower end position with the substrate heating unit held vacuum shielded in isolation from the common chamber, the substrate heating unit locked in pressure contact with the O-ring (hence the shaft for revolution held from descending further and thus locked) permits the gear for revolution 65 with rotational driving power transmitted from the rotary shaft 62 to be rotated relative to the shaft for revolution via the bearing 93 and to rotate the gear for rotation 88 and in turn the substrate holder rotating member 85, thereby rotating the substrate holder 48.

Consequently, the substrate holder can be brought into rotation in any one of the vacuum chambers.

An explanation is next given in respect of the shaft for revolution.

Figure 8:
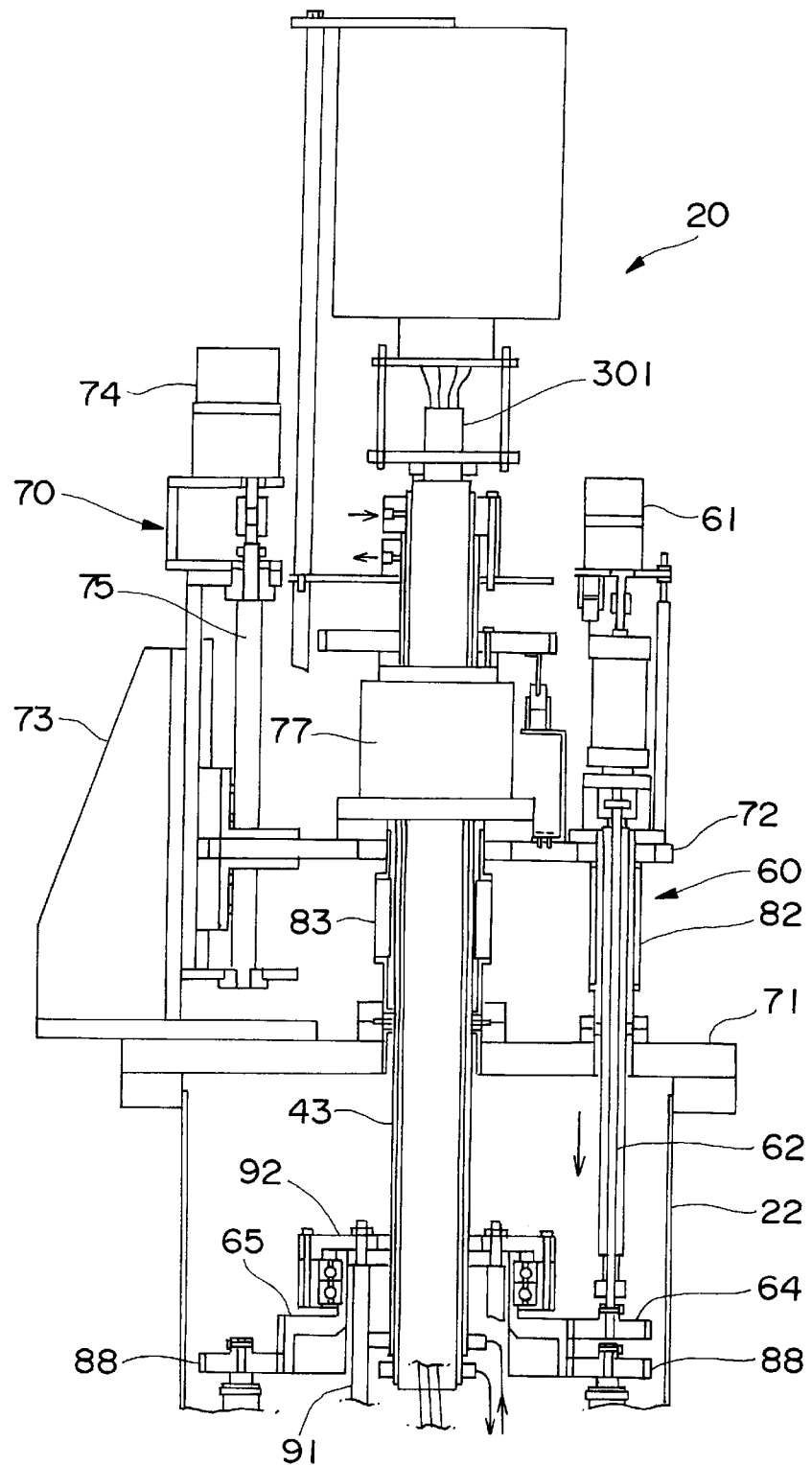
FIG. 8 is a cross sectional view that illustrates a shaft for revolution according to the second form of embodiment of the present invention.

FIG. 8 illustrates in a cross sectional view the shaft for revolution for use in the second form of embodiment of the present invention.

Referring to FIG. 8, the shaft for revolution 43 passes through a center of the combinatorial molecular layer epitaxy apparatus 20 according to the second form of embodiment, and extends across the common chamber at a vacuum and an outside thereof under an atmospheric pressure.

The shaft for revolution 43 has its upper end tight sealed with a slip ring 301 for vacuum shielding or sealing. Electrical wires led through the inside of the shaft for revolution are connected to a joint of the slip ring 301 that is attached to the shaft for revolution and axial movement therewith in sliding contact with its upper fixed takeout part ensure electrical connection.

Thus, using a slip ring allows the electrical wires led through the inside of the shaft for revolution to be connected through sliding contact to an external electrical system, even if the shaft for revolution is rotated and axially moved.

Hence no twisting of electrical wires accompanies even with such a shaft as is rotated and axially moved.

Figure 9:
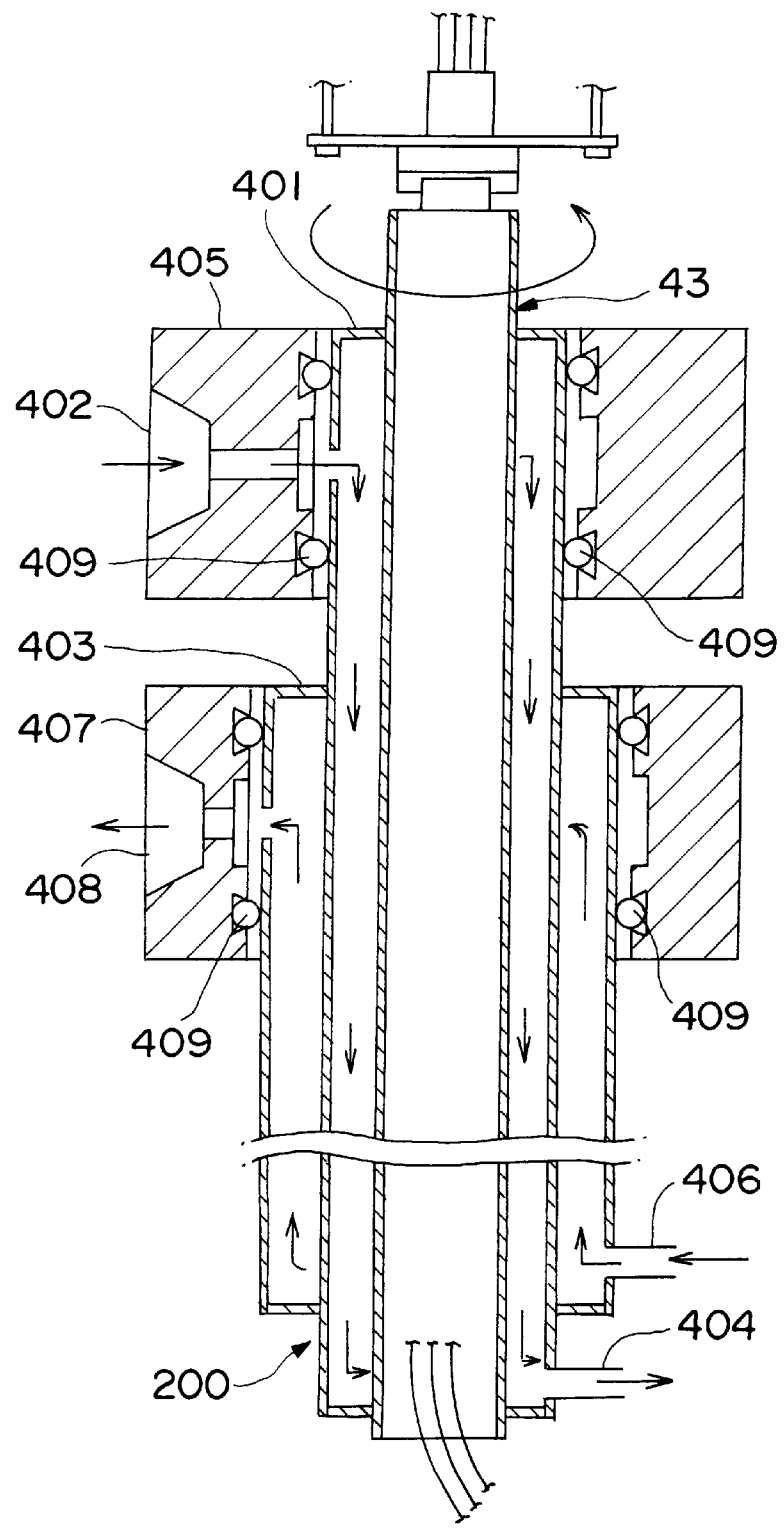
FIG. 9 is a detailed view that illustrates a pipe or conduit arrangement in the shaft for revolution according to the second form of embodiment of the present invention.

FIG. 9 illustrates details of the shaft for revolution in the second form of embodiment including fluid passages for cooling a lamp heater.

Referring to FIG. 9, the shaft for revolution 43 is provided with an inner and an outer cooling water conduits 401 and 403 coaxially. Cooling water is introduced from a cooling water inlet port 402 of a cooling water sealing unit 405 into the inner cooling water conduit 401. The cooling water is flowing out through an outlet port 404 in an end portion of the shaft for revolution 43 and then past the cooling water fluid passages of the lamp heater 201 and 202 (FIG. 2) is returned through a return inlet port 406. The return water is passed through the outer conduit 403 and discharged through a drain port 408 of a cooling water sealing unit 408. Further, it should be noted that the cooling water sealing units 405 and 407 are joined together and secured to the bracket (FIG. 3). The cooling water sealing units 405 and 407 are sealed water-tight with O-rings 409.

Consequently, a rotation of these conduits carried on the shaft for revolution accompanies no twisting of cooling water conduits.

An explanation is next given in respect of an operation in a process by an apparatus of the second form of embodiment of the invention. It should be noted that for the growth chamber an example is taken of a laser molecular beam epitaxy system, and specific conditions indicated are only for illustration.

Under a given pressure and at the room temperature, the carrier plate 38 is placed at its upper starting position, and a first substrate holder 48 is loaded into the chuck 45. Then, the carrier plate 38 is lowered to bring the respective substrate heating units 36 into pressure contact with their corresponding O-rings 41 and bring them to a halt. The preheating chamber 28 is held at a high vacuum, e. g., at $10^{-6}$ Torr in which cleaning is performed, and the temperature is raised at a rate of 10° C./minute up to 950° C.

On lapse of a given period of time, while the temperature of each of the substrate heating units is held unvaried, the common chamber and each of the vacuum chambers are returned to a given pressure, and the carrier plate 38 is moved to its upper starting position. Then, the carrier plate 38 is rotated to convey the substrate heating unit 36 loaded with the first substrate holder 48 to a position above the growth chamber 24. In this stage, a second substrate holder 48 with substrates to be processed next is or has been loaded into the chuck 45 of another substrate heater unit 36 which corresponds to the preheating chamber 28 at the room temperature, namely of that substrate heating unit 36 with the lamp heater 8 turned off.

The carrier plate 38 is then lowered to isolate the vacuum chambers from one another. The growth chamber 24 is evacuated, and held at a high vacuum, e.g., at $10^{-4}$ Torr, and heated and held heated at a temperature of 950° C., in which state a laser molecular beam epitaxial growth is accomplished therein. In this stage, the preheating chamber 28 is maintained at a high vacuum of $10^{-6}$ Torr and heated to raise its temperature at a rate of 10° C./minute up to 950° C.

In the growth chamber 24, molecular layer epitaxial growth for individual monomolecular layers may be effected to form a superstructure or superlattice successively on each of the substrates by permitting the substrate holder to be rotated. Thereafter, each of the vacuum chambers and the common chamber 22 are returned to a given pressure while the set temperature of 950° C. is maintained. Then, the carrier plate 38 are again moved to its upper starting position, and its rotation follows to convey the substrate heating unit 36 loaded with the first substrate holder 48 to a position above the annealing chamber 26. In this stage, a third substrate holder 48 is or has been loaded into the chuck 45 of the substrate heating unit 36 that corresponds to the preheating chamber 28.

The carrier plate 38 is then lowered again to isolate the vacuum chambers from one another. The annealing chamber 28 is reduced in pressure, and held at a pressure of, e. g., at 1 Torr, and cooled from a temperature of, e. g., from 950° C. at a cooling rate of 10° C./minute for a given period of time for annealing. In the annealing chamber control is effected to make the oxygen partial pressure optimum. After the lamp heater 8 is turned off to bring the annealing chamber at a room temperature, each of the vacuum chambers and the common chamber 22 are turned to a given pressure while leaving the other substrate heating units 36 and 36 at 950° C. In this state, the carrier plate 38 is moved to its upper starting position and is then rotated to return to its home position. The substrate holder with the substrates each with the epitaxial growth is removed and transferred into the stock housing 49. Then, the chuck 45 of the substrate heating unit 36 is loaded with a new, fourth substrate holder loaded with substrates to be processed.

Thus, the above described form of embodiment of the invention as well, permits [multiple raw materials]×[multiple substrates]×[reaction parameters such as temperature, pressure and flux from gas phase] to be selected or controlled independently of one another and put together in any desired combination, and hence is capable of synthesizing or bringing together in a single series of reactions a group of substances into a structure systematically controlled.

Moreover, an arrangement is provided in which the growth chamber 24 for forming monomolecular epitaxial growth layers on substrates, the annealing chamber 28 for annealing the thin film growth formed on substrates and the cleaning chamber 28 for preliminarily cleaning substrates are associated respectively with corresponding heating units 36, 36 and 36, and that has rendered pressure and temperatures controllable individually for each of the chamber/unit pairs, thus independently one pair from another. Consequently, it is made possible to convey substrates without the need for cooling or temperature reduction and to carry out the successive processes consecutively or without interruption.

An explanation is next given of a third form of embodiment of the present invention.

Figure 10:
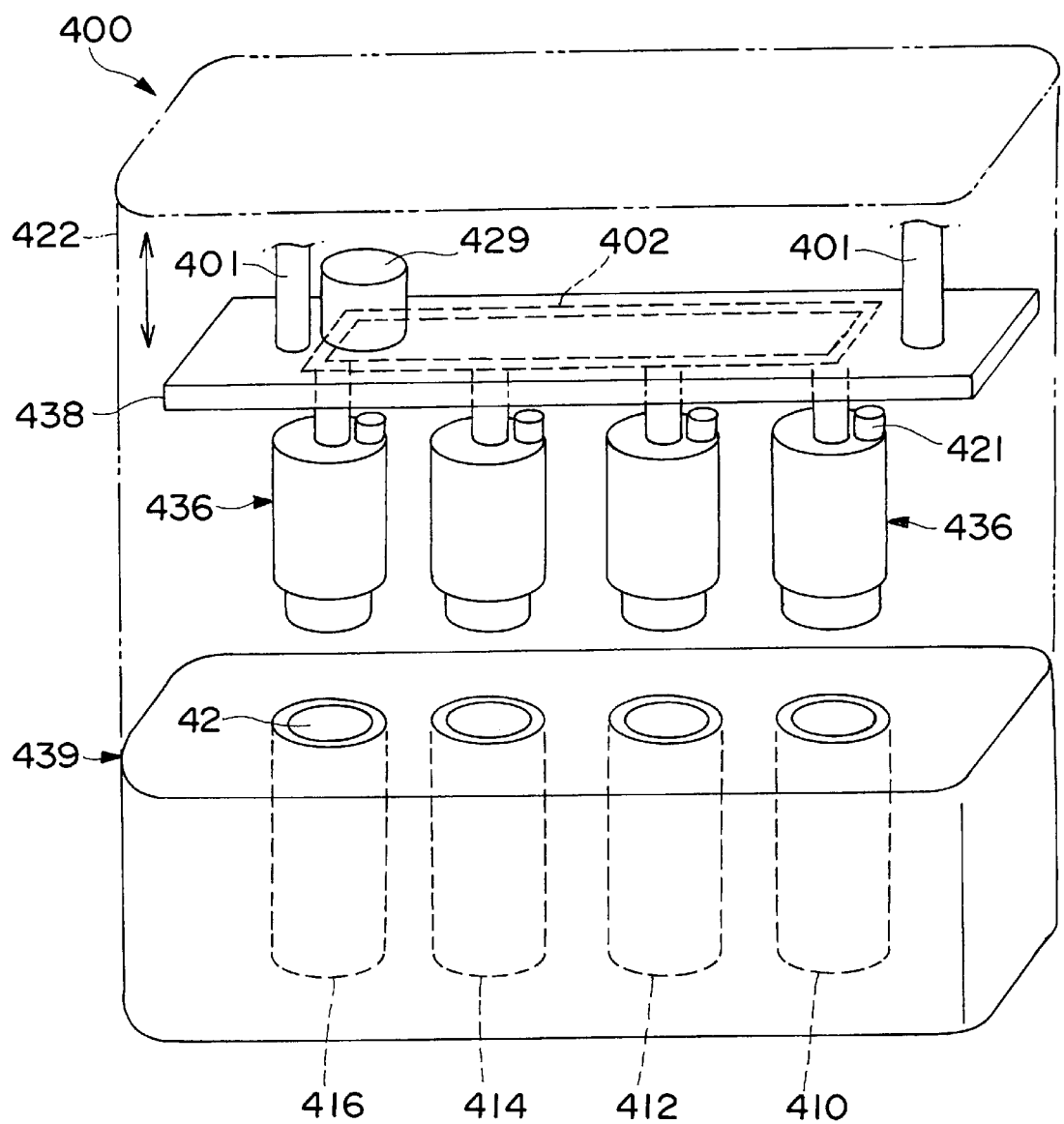
FIG. 10 is a view of appearance of an apparatus according to a third form of embodiment thereof of the present invention.

FIG. 10 illustrates the third form of embodiment in its appearance view.

In the third form of embodiment, the invention employs a construction in which heating units are arranged not on a circle but in a row, and so are arranged vacuum chambers corresponding to the heating units. Yet, it should be noted that the substrate holder loading lock chamber and so on are omitted.

As shown in FIG. 10, a combinatorial molecular layer epitaxy apparatus according to the third form of embodiment 400 includes a common chamber 422 in which substrate heating units 436 are conveyed into their respective processing chambers constituted by a preheating chamber 410, a growth chamber 412, an etching chamber 414 and an annealing chamber 416 and locked therewith, respectively. Each of the process chambers are thereby vacuum shielded or sealed to form an independent vacuum chamber that permits independent evacuation to a given high vacuum.

The common chamber 422 is designed to communicate with the preheating chamber 410, the growth chamber 412, the etching chamber 414 and the annealing chamber 413 through their respective openings 42 formed in a partition 439 each of which has an O-ring fitted in an annular groove formed around it. Further, each of the chambers is vacuum sealed to the partition 439 and securely held thereby.

The substrate heating units 436 is carried by a carrier plate 438 adapted to be moved vertically by vertically movable shafts 401 and 401 and are supported, e. g., on a chain conveyer, to move along a looped path 402 formed in the carrier plate 438. It should be noted further that a motor 429 is provided to convey the substrate heating units 436 along the looped chain conveyer path 402, and a motors 421 are also provided to rotate the substrate holders retained in the substrate heater units 436, respectively.

Figure 11:
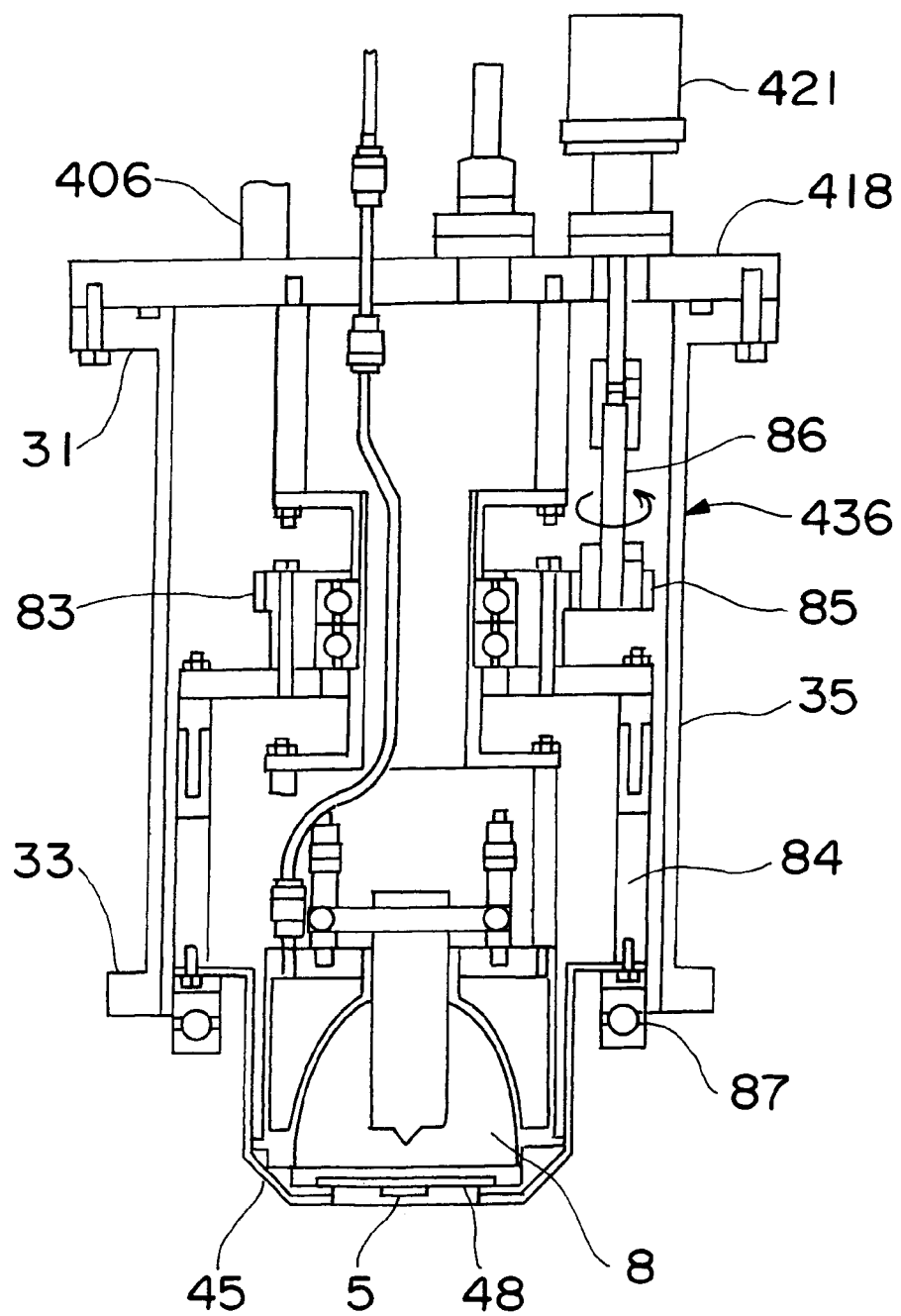
FIG. 11 is a detailed view that illustrates a substrate heating unit according to the third form of embodiment thereof of the present invention.

FIG. 11 illustrates in somewhat detailed view a substrate heating unit in the third form of embodiment of the invention, in which the same reference characters as used in FIG. 2 represent parts or components which are common to those in the second form of embodiment.

Referring to FIG. 11, the substrate heating unit in the third form of embodiment 436 is carried by the carrier plate 438 by means of a shaft 406 and is provided with a rotational drive mechanism for rotating the substrate holder in a configuration as shown in FIG. 2. The motor 421 for applying a rotational driving power to the rotary shaft 86 is carried on a top or upper cover 418.

Mention is next given of an operation of the third form of embodiment.

The carrier plate 438 is lowered to bring the flange 33 of the substrate heating unit 436 in pressure contact with the O-ring on the partition. The O-ring compressed causes the substrate heating unit to come to a halt. In this stage, each of the vacuum chambers is or has been vacuum sealed, individually evacuated to a given vacuum with pressure controlled and heated or has been heated to a given temperature, independently of one another.

Subsequently, the carrier plate 438 is caused to ascend and to come to a halt at its upper starting position, permitting the substrate heating units to move horizontally for positioning above their respective vacuum chambers. In movement of the substrate heating units, the substrate holder is rotated and a given temperature is held therefor.

This arrangement here again permits each of the vacuum chamber to be vacuum shielded or sealed to its heating counterpart, individually evacuated to a given vacuum with pressure controlled and heated to a given temperature, independently of one another.

It should be noted in connection with the above that the growth chamber may have a construction as in the first or second form of embodiment.

Industrial Applicability

As will be apparent from the foregoing description, a combinatorial molecular layer epitaxy apparatus according to the present invention is extremely useful as a monomolecular layer epitaxy apparatus to make an efficient search for a material or substance efficiently in a short period of time.

What is claimed is:

1. A combinatorial molecular layer epitaxy apparatus comprising:
   a common chamber having pressure therein controllable;
   one or more conveyable substrate heating units having a substrate holder for holding one or more substrates in the common chamber; and
   a plurality of process conducting chambers having pressure therein controllable and provided to correspond to the substrate heating units, said process conducting chambers including a growth chamber which has
      a multiple raw material supply means for supplying raw materials onto a said substrate held by a said substrate heating unit,
      a gas supply means for feeding a gas onto a surface of the substrate, and
      an instantaneous observation means for instantaneously observing epitaxial growth of monomolecular layers for each of the layers on the substrate surface,
      thereby permitting growth temperature, pressure and supply of the raw materials to be controlled for each of the substrates and producing a group of substances caused each to grow epitaxially in an individual monomolecular layer and brought together for each of the substrates, systematically in accordance with indications of the instantaneous observation means.

2. A combinatorial molecular layer epitaxial growth apparatus as set forth in claim 1, wherein said multiple raw material supply means includes a laser molecular beam epitaxy means for vaporizing with an excimer laser beam a plurality of targets of different solid raw materials and for forming a thin film of a composition as aimed on each of the substrates.

3. A combinatorial molecular layer epitaxial growth apparatus as set forth in claim 1, wherein said multiple raw material supply means includes a laser molecular beam epitaxy means and said substrates is composed of a material selected from the group which consists of $\alpha$-$Al_2O_3$, YSZ, MgO, $SrTiO_3$, $LaAlO_3$, $NdGaO_3$, $YAlO_3$, $LaSrGaO_4$, $Y_2O_5$, $SrLaAlO_4$, $CaNdAlO_4$, Si and compound semiconductors.

4. A combinatorial molecular layer epitaxial growth apparatus as set forth in claim 1 or claim 2, wherein said multiple raw material supply means includes a laser molecular beam epitaxy means, and the target solid raw materials include substances adapted to form a material selected from the group which consists of a high temperature superconductor, a luminescent material, a dielectric material, a ferroelectric material, colossal magnetoresistance material and an oxide material.

5. A combinatorial molecular layer epitaxy apparatus as set forth in any one of claims 1 to 3, wherein said multiple raw material supply means includes a target turn table supported to be rotatable and vertically movable for carrying targets, and a masking plate means disposed between said targets and said substrates and supported to be rotatable and vertically movable.

6. A combinatorial molecular layer epitaxy apparatus as set forth in claim 5, wherein said masking plate means includes a plurality of masking plates having different masking configurations which are exchangeable in succession while epitaxial growths are effected.

7. A combinatorial molecular layer epitaxy apparatus as set forth in claim 5, wherein said masking plate means comprises a mask movable horizontally with respect to said substrates and is adapted to cover and uncover either or both of a said substrate and a given area thereof with said movable mask.

8. A combinatorial molecular layer epitaxy apparatus as set forth in claim 1, wherein said multiple raw material supply means includes a laser molecular beam epitaxy means, and said instantaneous observation means comprises a reflex high-energy electron beam diffraction analysis means.

9. A combinatorial molecular layer epitaxy apparatus as set forth in claim 1, wherein the apparatus further includes a target loading lock chamber for loading said growth chamber with targets therein.

10. A combinatorial molecular layer epitaxy apparatus as set forth in claim 1, wherein said multiple raw material supply means includes a gas source molecular beam epitaxy means adapted to spray and thereby to supply a flow controlled stream of a gaseous organometallic compound through a nozzle means onto each of said substrates.

11. A combinatorial molecular layer epitaxy apparatus as set forth in claim 1, wherein said multiple raw material supply means includes a gas source molecular beam epitaxy means, and said instantaneous observation means comprises an optical means that makes observation based on any of reflectance differential spectroscopic, surface light absorbing and surface light interferometric processes.

12. A combinatorial molecular layer epitaxy apparatus as set forth in any one of claims 1, 10 or 11, wherein said multiple raw material supply means includes a gas source molecular beam epitaxy means, and said substrates comprise substrates composed of Si or a compound semiconductor.

13. A combinatorial molecular layer epitaxy apparatus as set forth in claim 1, wherein said substrates comprise a substrate whose surface is made flat on an atomic level and whose outermost atomic layer is identified.

14. A combinatorial molecular layer epitaxy apparatus as set forth in claim 1, wherein said common chamber is provided with a substrate holder loading lock chamber for exchanging the substrate holders in a state in which a high vacuum is held therefor.

15. A combinatorial molecular layer epitaxy apparatus as set forth in claim 1, wherein a said substrate heating unit is adapted to contact with its corresponding process conducting chamber to vacuum seal the same, said substrate heating unit and process conducting chamber then forming an independently pressure controllable vacuum chamber.

16. A combinatorial molecular layer epitaxy apparatus as set forth in claim 1, wherein said substrate heating units are jointly adapted to be turned around and vertically moved by a carrier plate so as to be conveyed into association with said process conducting chambers in succession.

17. A combinatorial molecular layer epitaxy apparatus as set forth in claim 1, wherein the apparatus further includes a shaft for revolution in the form of a tubular cylinder connected to an electric wiring and a service water piping outside of said common chamber and adapted to be turned and vertically moved in a state in which said common chamber means is held at vacuum, connecting a cooling water piping disposed in a region of each of said substrate heating units with connected to said service water piping, and a carrier plate with its center disposed in coincidence with an axis of rotation of said shaft for revolution.

18. A combinatorial molecular layer epitaxy apparatus as set forth in claim 17, wherein said shaft for revolution has attached thereto, a slip ring adapted to vacuum seal an upper end of said shaft for revolution and to connect said upper end electrically to said external electrical wiring, a cooling water sealing means for connection to said external service water piping, and a cooling water conduit means connected water tight to said cooling water sealing means and having said shaft for revolution passed therethrough coaxially to permit said shaft to rotate in a sliding contact therewith.

19. A combinatorial molecular layer epitaxy apparatus as set forth in claim 17 or 18, wherein said cooling water conduit means comprises an inner and an outer cooling water conduit disposed coaxially with said shaft for revolution and forming a single water passage.

20. A combinatorial molecular layer epitaxy apparatus as set forth in any one of claims 1 or 15 to 17, wherein said substrate heating units includes a substrate turning mechanism for rotating said substrate holder.

21. A combinatorial molecular layer epitaxy apparatus as set forth in any one of claims 1 or 15 to 17, wherein said substrate heating units are turnable and each includes a substrate turning mechanism that provides a rotation from a driving power for revolving said substrate heating units.

22. A combinatorial molecular layer epitaxy apparatus as set forth in any one of claims 1 or 15 to 18, wherein a said substrate heating unit includes a substrate turning mechanism for rotating said substrate holder in a said vacuum chamber.

23. A combinatorial molecular layer epitaxy apparatus as set forth in claim 1, wherein said process conducting chambers include an annealing chamber for annealing substrates held by a said substrate holder, a preheating chamber for preheating the substrates held by said substrate holder to a given temperature in a high vacuum, and a growth chamber for forming a thin film on a said substrate held by said substrate holder, and an etching chamber for etching said substrate with the thin film caused to grow and formed thereon.

24. A combinatorial molecular layer epitaxy apparatus as set forth in any one of claims 1 or 14, wherein a said substrate holder is formed with openings each in the form of a slit, arranged to surround one or more substrates.

25. A combinatorial molecular layer epitaxy apparatus as set forth in any one of claims 1 or 14, wherein a said substrate holder is in the form of a disk that is hollow inside and having its side wall formed with an annular groove that permits said substrate holder to be held on a said substrate heating unit.

26. A combinatorial molecular layer epitaxy apparatus as set forth in any one of claims 1 or 14, wherein said substrate holder comprises a holder ring having a stepped edge inside and having its side wall formed with an annular groove that permits said substrate holder to be held on a said substrate heating unit, and a holder plate in the form of a disk to be seated on the stepped edge of said holder ring for supporting one or more substrate on its side facing said substrate heating unit, said disk holder plate being formed of a material that is high in heat absorbing efficiency.

27. A combinatorial molecular layer epitaxy apparatus as set forth in claim 26, wherein said holder plate formed of said material that is high in heat absorbing efficiency is constituted by an inconel plate with a surface region oxidated at a high temperature.

28. A combinatorial molecular layer epitaxy apparatus as set forth in any one of claims 1 or 15 to 17, wherein said substrate heating means comprises a lamp heater.

29. A combinatorial molecular layer epitaxy apparatus as set forth in claims 26, wherein said substrate holder is arranged to lie at a focusing position of the lamp heater.

30. A combinatorial molecular layer epitaxy apparatus as set forth in claim 26, wherein said holder plate is arranged to lie at a focusing position of the lamp heater constituting said substrate heating unit.

* * * * *